US005604709A

United States Patent [19]
Price

[11] Patent Number: 5,604,709
[45] Date of Patent: Feb. 18, 1997

[54] PERSISTENT DATA STORAGE WHICH UTILIZES A SHARED POWER SUPPLY

[75] Inventor: Noah M. Price, Campbell, Calif.

[73] Assignee: Apple Computer, Inc., Cupertino, Calif.

[21] Appl. No.: 512,180

[22] Filed: Aug. 7, 1995

[51] Int. Cl.$^6$ .................................................. G11C 7/00
[52] U.S. Cl. .................... 365/229; 365/226; 365/154; 364/707
[58] Field of Search ................................ 365/229, 226, 365/154; 364/707; 371/66

[56] References Cited

U.S. PATENT DOCUMENTS

| | | | |
|---|---|---|---|
| 5,001,670 | 3/1991 | Slate et al. | 365/229 |
| 5,016,223 | 5/1991 | Kimura et al. | 365/229 |
| 5,375,246 | 12/1994 | Kimura et al. | 365/229 |

*Primary Examiner*—David C. Nelms
*Assistant Examiner*—Huan Hoang
*Attorney, Agent, or Firm*—Burns, Doane, Swecker & Mathis, L.L.P.

[57] ABSTRACT

A relatively inexpensive static random access memory is utilized to store persistent data in a computer. To provide the SRAM with this capability, it is connected to a source of power within the computer that includes a battery. The source of power is connected to the SRAM in a manner such that the SRAM is in an enabled state whenever any power is available to it, from either a battery or a power supply connected to a regulated voltage source. When the computer is turned off, to prevent devices connected to the SRAM from draining current being provided by the battery, a chip select terminal of the SRAM is isolated from other circuits on the computer, to prevent leakage.

14 Claims, 2 Drawing Sheets

PERSISTENT DATA STORAGE WHICH UTILIZES A SHARED POWER SUPPLY

FIELD OF THE INVENTION

The present invention is directed to memories that are used to store persistent data in computers and the like, and more particularly to the supply of power to memories of this type.

BACKGROUND OF THE INVENTION

A typical computer contains a number of different types of memories for storing data. For example, an electronic random access memory (RAM) is normally used as the main working memory for the computer while it is operating. Typically, a dynamic random access memory (DRAM) is used for this purpose. This type of memory is volatile, which means that any data stored therein is lost as soon as the power to the memory disappears, e.g. the computer is turned off. For permanent storage of data, a computer typically includes various forms of non-electronic memory, e.g. magnetic and/or optical disks.

In addition to these two primary forms of memory, a computer may also include smaller, non-volatile electronic memories for storing persistent information that pertains to the operation of the computer. In the context of the present invention, "persistent" data is data that must continue to be stored in the computer after the computer is turned off, and thereby be available each subsequent time the computer is turned on. For example, the computer may include a read-only memory (ROM), which functions as a control store that contains microprograms for the computer's instructions, as well as startup and interrupt processing information. Since this type of memory has read-only capabilities, it is not suited for storing variable information. However, it may be desirable to use an electronic memory to store persistent data that is changeable. For example, a user may configure a computer with certain desired operating preferences that remain in effect each time the computer is used. While it is possible to store this type of information on a magnetic or optical disk, and load it into the computer's random access memory each time the computer starts, it is preferable to store these parameters in an electronic random access memory.

In order for a random access memory to effectively store persistent data, the memory must be provided with a continuous supply of power to preserve the contents of the data stored therein. One type of memory that functions in this manner is a non-volatile memory. Typically, non-volatile random access memories have been available as self-contained devices, which include an integral battery that functions as the source of continuous power. Since the non-volatile RAM is incorporated within the structure of the computer, it is desirable that the battery which supplies power to it have as long a life as possible, to thereby minimize the inconvenience of having to replace the battery. Accordingly, non-volatile random access memories which include an integral power supply have employed lithium batteries, because of their long life. Unfortunately, lithium batteries are relatively expensive, which means that the overall cost of a non-volatile random access memory can be quite high. Furthermore, since the battery is integral with the memory, when the battery's power has been consumed, the entire non-volatile memory device must be replaced, which further adds to the overall cost to the consumer.

Another type of electronic memory device that has been employed in the past to store persistent data is a flash EEPROM. Unfortunately, these types of devices are relatively expensive, in part due to the fact that they are typically designed to store large amounts of information, and therefore are not cost-justifiable for use as a parameter RAM or in other situations where only relatively small amounts of persistent data, e.g., less than 8K bytes, needs to be stored. In addition, they require a complex interface for reading and writing data, which further adds to their expense.

In addition to the non-volatile RAM, modern computers include other components which require a constant source of power. For example, the computer might include a real-time clock chip which maintains the proper date and time of day, even when the computer is turned off. Some computers may also include a microcontroller that controls initial power-up of the computer, and is therefore kept constantly operational by a battery. Since each of these components also requires a continuous source of power, some computers may include a battery which is separate from the battery incorporated into the non-volatile random access memory. The presence of two or more batteries in a computer, one of which is dedicated to non-volatile random access memory, and another which powers other components, results in a concomitant increase in the overall price of the computer, particularly when relatively expensive batteries, such as lithium batteries, are employed.

It is desirable, therefore, to provide an arrangement in which a single battery can be utilized as the source of power for all non-volatile components in a computer, including a RAM for storing persistent data. In such a case, a less expensive memory device, which does not include an integral battery, can be employed for persistent data storage.

SUMMARY OF THE INVENTION

In accordance with the present invention, the foregoing objective is achieved by utilizing a relatively inexpensive static random access memory (SRAM) as the persistent data RAM in a computer. To provide the SRAM with permanent storage capabilities, it is connected to a source of power within the computer that includes a battery. The source of power is connected to the SRAM in a manner such that the SRAM is in an enabled state whenever any power is available to it, from either a battery or a power supply connected to a higher voltage source, such as household current. However, the SRAM is not able to carry out read and write operations unless a higher level of voltage is available, e.g. the computer is turned on. With this approach, the contents of the memory are preserved when the computer is turned off.

Even when the computer is turned off, there is the possibility that devices connected to the SRAM could drain the current being provided by the battery, and thereby cause the battery's capacity to quickly diminish. To prevent such a possibility, one or more input/output terminals of the SRAM are isolated from other circuits on the computer, to prevent leakage current which could drain the battery.

The foregoing features of the present invention, and the advantages offered thereby, are explained in greater detail hereinafter with reference to a preferred embodiment illustrated in the accompanying drawings.

DETAILED DESCRIPTION

To facilitate an understanding of the present invention, it is described hereinafter with particular reference to its implementation in a computer. It will be appreciated, however, that the practical applications of the invention are not limited to this specific embodiment. Rather, the principles of the invention can be employed wherever it is desirable to have an electronic random access memory store persistent data in an environment where a source of power for providing continuous current to the memory is available.

Figure 1:
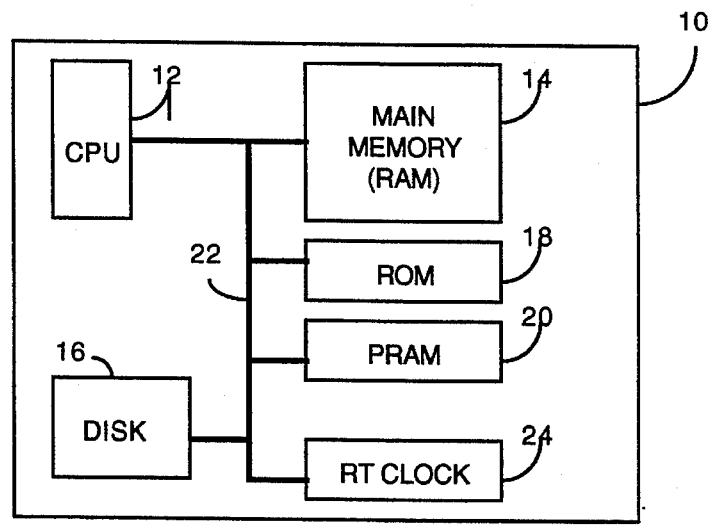
FIG. 1 is a general block diagram of an exemplary computer of the type in which the present invention can be employed.

FIG. 1 is a block diagram that illustrates the components of an exemplary computer of the type in which the present invention might be employed. Referring thereto, a computer 10 includes a central processing unit (CPU) 12 which performs data processing operations. The information which is used by the CPU is stored in a main memory 14, which typically comprises a relatively large, low cost dynamic random access memory. Being a volatile device, the data stored in the random access memory is available only so long as power is being supplied to it from the main power supply of the computer (not shown). As soon as the computer is turned off, all data stored in the main memory 14 is lost. To provide permanent storage of data, therefore, the computer also includes non-electronic rewritable memory, such as a magnetic disk 16.

Certain information needed by the CPU for proper operation is determined at the time the computer is designed, and not changed thereafter. For example, this information can include microprograms for the computer's instructions, as well as startup and interrupt processing routines. Typically, this type of information is stored in a read only memory (ROM) 18.

The ROM 18 contains fixed data that determines certain aspects of the operating configuration of the computer. In addition to this non-variable information, it is also desirable to store various user settings that likewise determine the configuration of the computer. Since these settings can be varied by the user, it is not appropriate to store them in a ROM. For this purpose, a persistent data random access memory 20 is incorporated in the computer. Examples of the type of information that can be stored in the non-volatile RAM 20 include the date and time, which is updated on a regular basis, configuration parameters for external devices such as modems and printers, settings for internal devices such as speaker volumes and the like, and user feedback settings such as sensitivity of keyboards and cursor pointing devices. This type of RAM is sometimes referred to as the parameter RAM, or PRAM.

All of these various forms of memory communicate with the CPU 12 through one or more internal busses 22.

To function as a persistent data storage device, the PRAM 20 requires a constant source of power. In addition to this device, other components in the computer system may require power when the computer is turned off. For example, the computer may include a real time clock chip 24, which provides pulses at regular intervals that are used to update the time value stored in the PRAM 20. To provide the constant source of power, the computer typically includes a battery (not shown).

Figure 2:
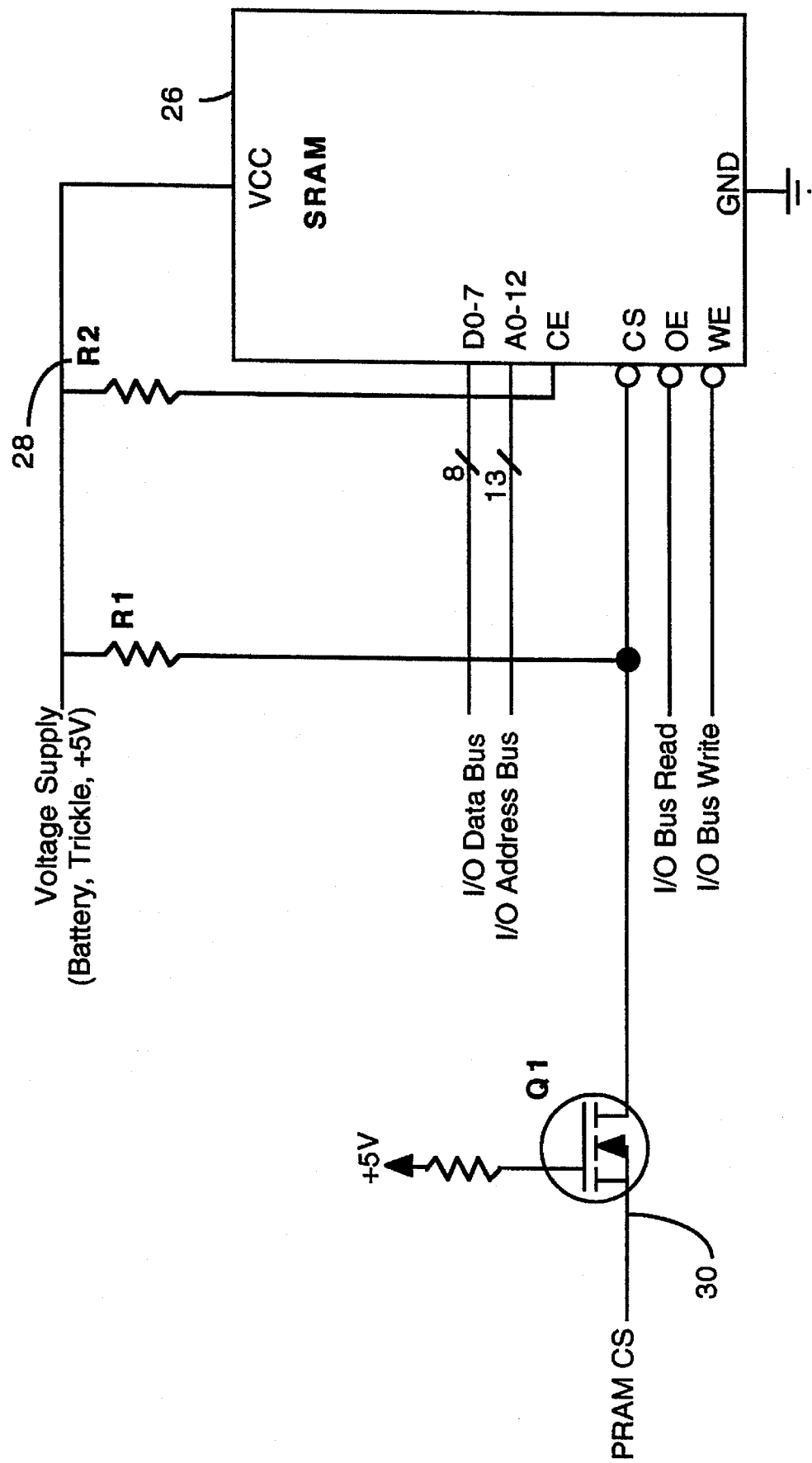
FIG. 2 is a schematic circuit diagram illustrating the connection of an SRAM to a power supply to provide persistent data storage capabilities.

In accordance with the present invention, the PRAM 20 comprises a static random access memory that receives a continuous supply of power from the same source as other components in the computer, such as the clock chip 24. FIG. 2 is a schematic diagram of a circuit containing a static random access memory that is employed as a persistent data memory. Referring thereto, a static random access memory 26 includes two power supply terminals, respectively labeled VCC and GND. The memory also includes conventional data, address, write enable and read enable (or output enable) terminals, that are connected to respective busses and control signal lines. An inverted chip select terminal CS receives an input signal that controls the operation of the memory. When the chip select signal is asserted, i.e. pulled low in the embodiment of FIG. 2, data can be read from and written into the memory. When the chip select signal is deasserted, the memory operates in a low power mode, in which read and write operations are inhibited.

Figure 3:
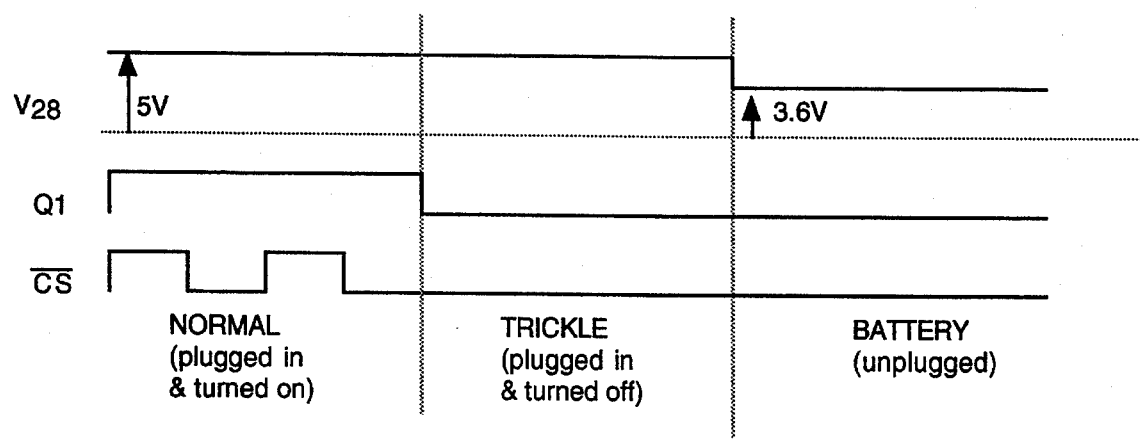
FIG. 3 is a timing diagram illustrating the state of the power supply at different times in the circuit of FIG. 2.

The VCC power terminal of the SRAM is connected to a voltage supply line 28 that provides power in three different states. Referring to FIG. 3, when the computer is operating in its normal state, i.e. it is plugged in and turned on, the power on the supply line 28 is at a nominal voltage level, e.g. +5 volts, which is provided from the main, regulated power supply of the computer. In this state, power is also supplied to the other electronic components in the computer. If the computer is turned off, the power to the other components of the computer is terminated. In this case, power is supplied to the SRAM 26 in a standby mode. More particularly, if the computer remains plugged in, a trickle supply of 5 volts is provided on the supply line 28. This supply is labeled a "trickle" supply since it is at a low amperage level, e.g., 1A, in comparison to the normal 5 volt supply which might be rated at about 30A, for example. When the computer is unplugged, voltage is supplied from a battery. For example, this voltage might be on the order of about 3.6 volts when the battery is fully charged.

The inverted chip select terminal of the SRAM is connected to the voltage supply line 28, through a resistor R1. Since the chip select terminal is inverted, the voltage on the supply line functions to deassert the chip select terminal. This terminal is asserted when the voltage from the power supply is pulled to ground by a PRAM chip select signal that is generated on a signal line 30 by other circuitry in the computer, such as a memory controller (not shown).

The illustrated embodiment of the SRAM includes a chip enable (CE) function. Unlike the chip select terminal, the chip enable terminal is not inverted. Thus, the signal at this terminal must be high for the memory to be active. In the illustrated embodiment, it is desirable to use only one signal, i.e., the chip select signal, to control the state of the memory. Therefore, it is preferable to keep the signal at the chip enable terminal high. For this reason, this terminal is connected to the power supply line 28 through a resistor R2.

The circuitry to which the chip select terminal is connected could provide a path to ground when the computer is turned off and power is supplied in the standby mode. In such a case, it is possible that the battery could be drained, through the resistor R1. To prevent such a situation from occurring, an FET switch Q1 is provided in the chip select signal line 30. This switch has its source and drain terminals connected to the chip select signal line, and its gate terminal is connected to the regulated voltage supply. In operation, when the computer is turned on, and power is supplied from the regulated power supply, the FET switch Q1 is also turned on, thereby permitting chip select signals to be applied to the SRAM. However, when the computer is turned off, the FET switch Q1 is also turned off. As a result, the chip select terminal of the SRAM is deasserted. In this state, the SRAM is kept inactive, by means of the voltage provided through the resistor R1 to the chip select terminal of the SRAM. Since the FET switch Q1 is off, the power supply line 28 is isolated from other connections which could potentially drain the battery.

From the foregoing, it can be seen that the present invention provides an arrangement by which a conventional, low-power static random access memory can be employed for the storage of persistent data. This arrangement eliminates the need for a more expensive non-volatile RAM that has its own power supply, or a flash memory, and thereby reduces the overall cost of products.

It will be appreciated by those of ordinary skill in the art that the present invention can be embodied in other specific forms without departing from the spirit or essential characteristics thereof. The presently disclosed embodiments are considered in all respects to be illustrative, and not restrictive. The scope of the invention is indicated by the appended claims, rather than the foregoing description, and all changes that come within the meaning and range of equivalence thereof are intended to be embraced therein.

What is claimed is:

1. An electronic memory circuit for the storage of persistent data, comprising:

a memory device having a select terminal for receiving a signal which controls the memory to selectively permit data to be read therefrom and having an enable terminal for coupling a supply voltage;

a source of power for supplying said supply voltage in at least two different states including a normal operating state and a standby state, said supply voltage being inversely coupled to said select terminal with respect to said enable terminal; and a switch responsive to the state of said power source for selectively isolating said select terminal from a source of said signal when said power source is in said standby state.

2. The memory circuit of claim 1 further including means for connecting said power source to said select terminal to normally inhibit data from being read from said memory device.

3. The memory circuit of claim 1 wherein, during said normal operating state, power is supplied to said memory device and to other electrical components to which said memory device is connected.

4. The memory circuit of claim 3 wherein, during said standby state, power is not supplied to said other electrical components.

5. The memory circuit of claim 4 wherein, during said standby state, power is supplied to said memory device from a battery.

6. The memory circuit of claim 4 wherein, during said standby state, power is supplied to said memory device as a trickle charge from a regulated power supply.

7. The memory circuit of claim 1 wherein said memory device is a static random access memory.

8. The memory circuit of claim 1 wherein said switch is an FET.

9. A method for using a static random access memory to store persistent data comprising the steps of:

providing a continuous supply of power to an enable terminal of said memory in a normal state or a standby state;

connecting the supply of power to a select terminal of said memory to normally inhibit data from being read from or written into said memory;

applying a select signal to said select terminal to permit data to be read from and written into said memory; and selectively isolating said select terminal from a source of said select signal in dependence upon whether said supply of power is in said normal state or said standby state.

10. The method of claim 9 wherein said select terminal is isolated from said signal source when said supply of power is in said standby state.

11. The method of claim 9 wherein the step of supplying power during said normal state includes supplying power to other electrical components to which said memory is connected.

12. The method of claim 11 wherein, during said standby state, power is not supplied to said other electrical components.

13. The method of claim 12 wherein power is supplied to said memory from a battery during said standby state.

14. The method of claim 12 wherein power is supplied to said memory as a trickle charge from a regulated power supply during said standby state.

* * * * *